United States Patent [19]

Höglund

[11] 4,262,262
[45] Apr. 14, 1981

[54] ELECTRIC AMPLIFIER

[76] Inventor: Lennart H. E. Höglund, Lindalsvägen 5, Spånga, Sweden

[21] Appl. No.: 8,188

[22] Filed: Jan. 31, 1979

[30] Foreign Application Priority Data

Feb. 7, 1978 [SE] Sweden .................. 7801377

[51] Int. Cl.³ .................. H03F 3/30; H03F 3/68
[52] U.S. Cl. .................. 330/267; 330/276; 330/295; 330/296; 330/297
[58] Field of Search .................. 330/124 R, 165, 199, 330/202, 267, 276, 295, 296, 297

[56] References Cited

U.S. PATENT DOCUMENTS

| 3,497,820 | 2/1970 | McKee | 330/276 |
| 3,579,136 | 5/1971 | Machamer | 330/296 |
| 3,832,643 | 8/1974 | Van Heyningen et al. | 330/276 X |
| 4,117,418 | 9/1978 | Hoglund | 330/296 |

FOREIGN PATENT DOCUMENTS 404858 1/1977 Sweden .
408250 6/1978 Sweden .

Primary Examiner—James B. Mullins
Attorney, Agent, or Firm—Fleit & Jacobson

[57] ABSTRACT

An electrical amplifier comprising several partial amplifiers, which are so connected and voltage fed that each of them amplifies a voltage interval of an input voltage, wherein every partial amplifier is power fed by two supply voltage equipments, which may have the same polarity and are connected to different active components in the amplification unit of each partial amplifier. This gives great flexibility, considerable simplification in mode of operation and possibility to improve the degree of efficiency and reduces the distortion through simple means, especially at the occurence of reactive loads.

12 Claims, 7 Drawing Figures

ELECTRIC AMPLIFIER

The present invention relates to amplifiers consisting of partial amplifiers working in class A and AB as well as in class C.

The present invention relates more precisely to an entire class of electric amplifiers, which all belong to the type defined in the introduction and which is characterized thereby, that every partial amplifier is power fed by two supply voltage equipments, which may have the same polarity and are connected to different active components in the amplification unit of each partial amplifier. This gives great flexibility, considerable simplification in mode of operation and possibility to improve the degree of efficiency and reduces the distortion through simple means, especially at the occurence of reactive loads.

The character of the amplifier according to the present invention will be more clear from the enclosed claims.

The invention will now be described in connection with accompanying drawings and by way of some preferred embodiments.

Figure 7:
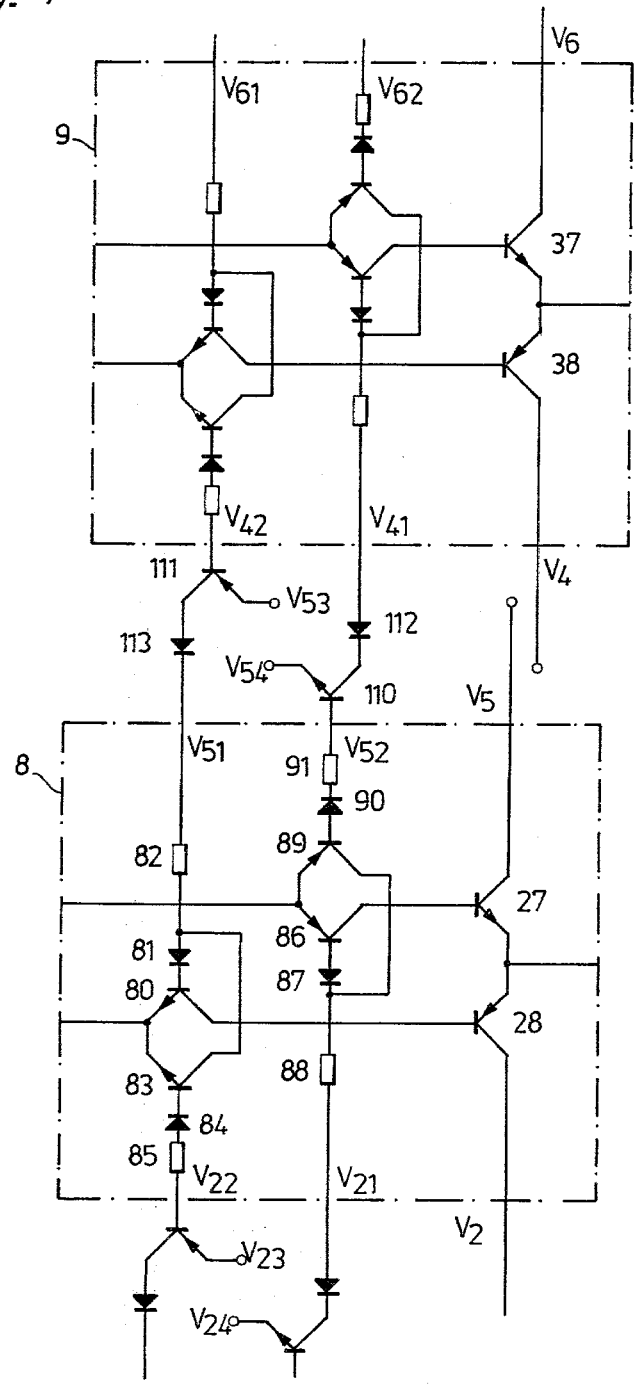

Finally FIG. 7 shows a diagram with two partial amplifiers in order to illustrate how the control of the change-over of the output effect between these amplifiers may be achieved.

Figure 1:
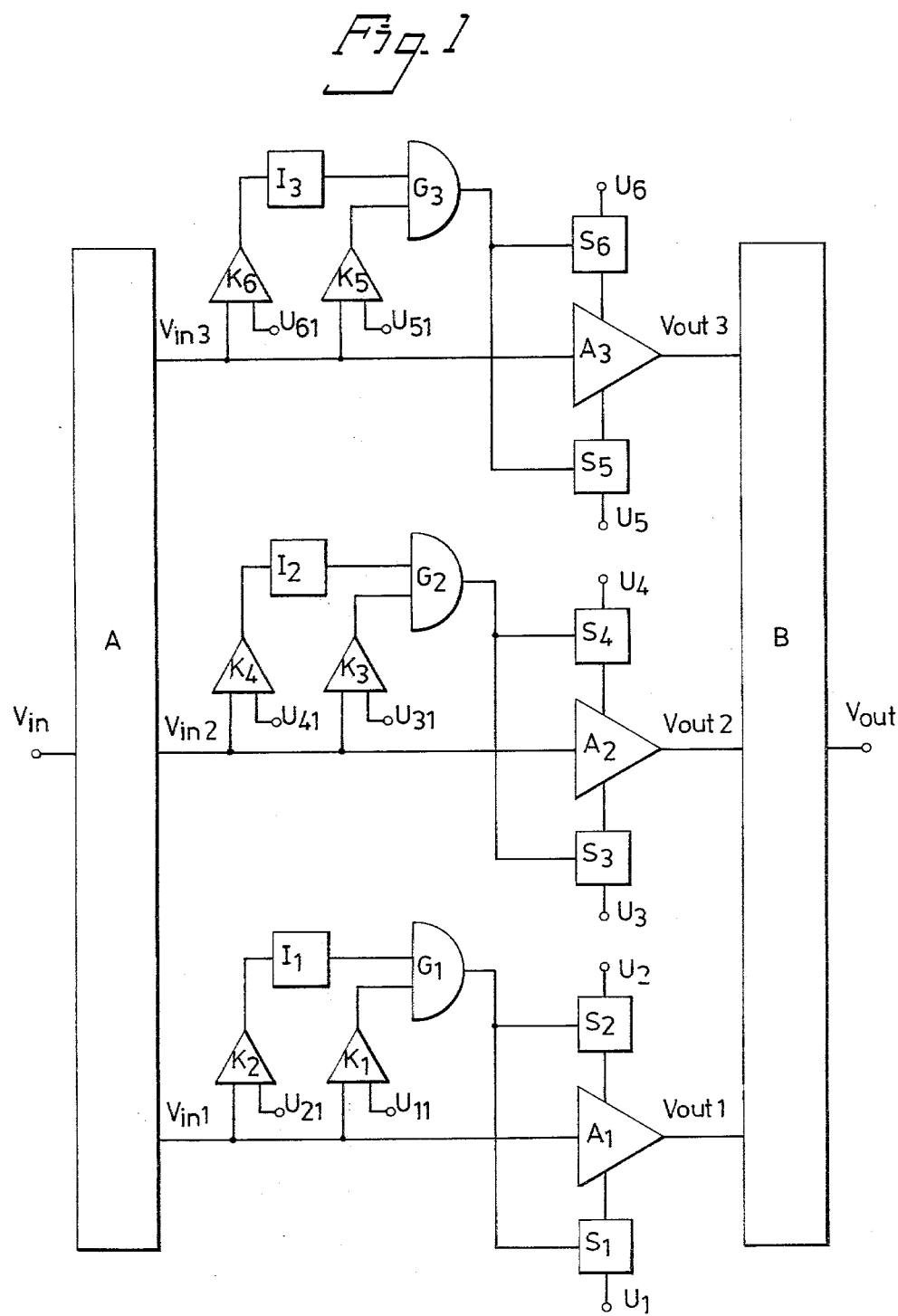
FIG. 1 shows a general block diagram of an electric amplifier consisting of partial amplifiers according to the present invention.

FIG. 1 shows a general block diagram for amplifiers consisting of partial amplifiers. The input voltage $V_{in}$ in FIG. 1 is fed to a network A, which can for example consist of a transformer with taps to every partial amplifier or, for example, a common connecting point for all partial amplifiers. From the input network A comes the input voltage $V_{in1}$ to the first partial amplifier. This voltage arrives to two comparators $K_1$ and $K_2$ and is compared with the potentials $U_{11}$ and $U_{21}$. The output voltage of the comparator $K_1$ arrives to an And-gate $G_1$, which via an inverter $I_1$ also is fed from the comparator $K_2$. The gate $G_1$ controls two switches $S_1$ and $S_2$, which switch on the battery voltages $U_1$ and $U_2$, respectively to the partial amplifier $A_1$. Its output voltage $V_{out1}$ is fed to a common network B which can be similar to the network A.

FIG. 1 shows two further partial amplifiers fed from the distribution network A with the input voltages $V_{in2}$ respectively $V_{in3}$ and giving the output voltages $V_{out2}$ respectively $V_{out3}$ to a common network B giving an output voltage $V_{out}$.

The amplifier in FIG. 1 receives the input voltage $V_{in}$ and distributes it to each partial amplifier respectively, which within its interval amplify the input voltage and via the common network B put the voltages together to an output voltage $V_{out}$, which is proportional to the input voltage $V_{in}$.

Every partial amplifier functions in the same manner, and in the first partial amplifier for example the input voltage $V_{in1}$ will be compared to the gate voltages $U_{11}$ and $U_{21}$ in the comparators $K_1$ and $K_2$, which are giving logical ones if the input voltage $V_{in1}$ is greater than the comparison voltages $U_{11}$ and $U_{21}$. By inverting the output signal from the comparator supplied with the upper gate voltage $U_{21}$ and then feeding the signal to an And-gate $G_1$, where also the comparator for the lower gate voltage $U_{11}$ is connected, one gets a logical one from the gate if the voltage is between $U_{11}$ and $U_{21}$.

The switches $S_1$ and $S_2$, which are controlled from the And-gate $G_1$, connect the battery voltages $U_1$ and $U_2$ to the amplifier $A_1$, which is fed with the input voltage $V_{in1}$. The battery voltages $U_1$ and $U_2$ are so chosen, that the range of possible voltage swing of the amplifier $A_1$ at the input just corresponds to the interval being defined by the gate voltages $U_{11}$ and $U_{21}$. Then $U_2$ can supply outgoing current and $U_1$ receive current dependent on for example reactive load.

Before or when the input voltage $V_{in}$ exceeds the upper gate voltage $U_{21}$, the second partial amplifier starts to function as its input voltage $V_{in2}$ then exceeds its lower gate voltage $U_{31}$.

The application of the above principle using semiconductors will be described in the sequel yet without precise correspondence to FIG. 1.

Figure 2:
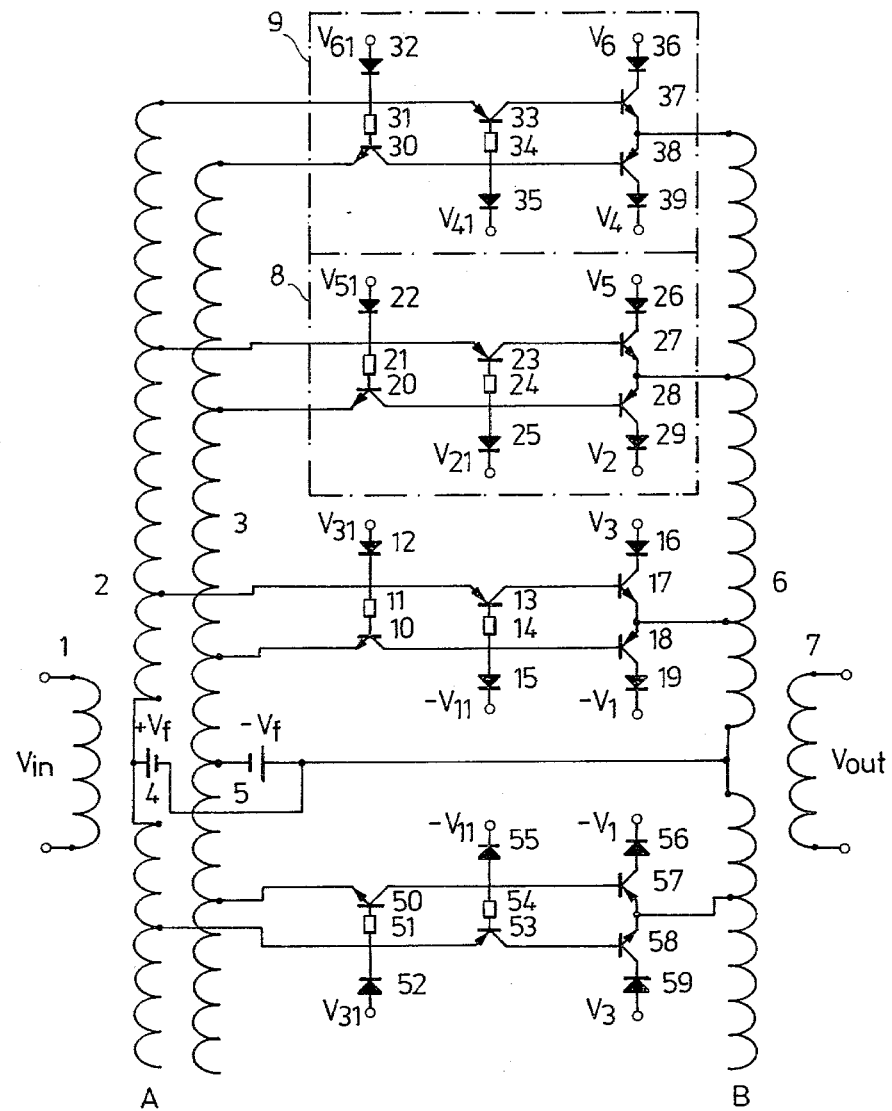
FIG. 2 shows how the amplifier of FIG. 1 can be constructed if transistors are used in gates and as amplification elements, and there are transformers as input and output circuits.

FIG. 2 shows an example of an amplifier according to class GA, GAB or GBR, where R indicates that the amplifier can deal with reactive effect.

To an output circuit consisting of a push-pull output transformer B with many taps, there are connected a number of, for example class A, partial amplifiers. They have the property, that the output impedance is high when saturated both for positive and negative voltages. The partial amplifiers receive input signals only for voltages within an interval where the partial amplifier is linear.. For other voltages the partial amplifier is made currentless in order to avoid loading of the batteries.

The input signal feeds a primary winding 1 in an input transformer A. Two identically equal secondary windings 2, 3 with centre tapping are positively and negatively biased, respectively with the help of batteries 4, 5. The secondary windings 2, 3 have many taps, to which the input circuits of the partial amplifiers are connected. One tap on the winding 2 with positive biasing is connected to the npn-transistor 27 via emitter and collector on a pnp-transistor 23, transferring the signal if the voltage from the tap on the winding is greater than a lower gate voltage $V_{21}$, which via a diode 25 and a resistance 24 is connected to the base of the transistor 23.

The corresponding tap on winding 3 is equally connected via a npn-transistor 20 to the pnp-transistor 28. The transistor 20 transfers the signal if the voltage from the connected tap on the winding is less than an upper gate voltage $V_{51}$, which via a diode 22 and a resistance 21 is connected to the base. The diodes 22 and 25 are so turned, that base current can flow in the transistors 20 and 23 and the purpose of the diodes is to protect the transistors 20 and 23 against great back voltages at the bases. The diode 29 constitutes the lower gate for the transistor 28 and the diode 26 upper gate for the transistor 27.

In the amplifier according to FIG. 2 are shown three further partial amplifiers. The components 10 to 19 form part of the first partial amplifier for positive voltages. The just above described amplifier with the components 20 to 29 is the second positive partial amplifier 8 and the components 30 and 39 constitute the third positive partial amplifier 9. A negative partial amplifier is also shown, which has the components 50 to 59.

If it holds true for the battery voltages that:

$$-V_1 = -V_{11} < V_{31} = V_3 + V_2 = V_{21} < V_{51} = V_5 = V_4 = V_{41} < V_{61} = V_6$$

the output transistors will be conducting in the order 17 and 18, 27 and 28, 37 and 38. If the input voltages to the second partial amplifier 8 are less than $V_2 = V_{21}$, the base current goes through the resistance 21, so that the transistor 20 will be conducting and base current goes to the transistor 28, which however does not get any collector current, as the diode 29 blocks the current. The transistor 23 is not conducting, as it does not get any base current. The transistor 27 can not conduct either. If the input voltage increases so that it somewhat exceeds $V_2 = V_{21}$, the transistor 23 and the diode 29 will be conducting, so that both the transistors 27 and 28 will carry collector current. A current flows between $V_5$ and $V_2$ and will be defined essentially by the biasing voltages $+V_f$ and $-V_f$ from the batteries 4 and 5. Another current goes to the tap on the winding 6 in the output transformer. The direction of the current is depending upon whether the input or output voltage is the greatest. By pure resistive load connected to the output winding 7, a current from the battery voltage $V_5$ flows via the diode 26 and the transistor 27 to the output winding. If the output voltage for example on account of reactive load, is temporarily greater than the input voltage, current flows from the output winding through the transistor 28 and the diode 29 and recharges the battery $V_2$.

With the help of the biasing voltages $+V_f$ and $-V_f$ the cross current between $V_5$ and $V_2$ can be made greater than the load current to the output transformer and the amplifier is then working in class GA. If the cross current is less than the load current, the amplifier is working in class GAB. If the cross current is nearly zero, the amplifier works in class GBR, where R indicates that the amplifier at a positive output voltage even if working in class B yet can have a negative output current and therefore can be connected to reactive loads without resulting strong distortions.

If it holds true for the battery voltages that:

$$-V_1 < V_{11} < V_2 = V_{31} < V_3 = V_{21} < V_{51} = V_4 < V_5 = V_{41} < V_{61} < V_6$$

the output transistors will be conducting in the order 18 and 17, 17 and 28, 28 and 27, 27 and 38, 38 and 37 for an increasing input voltage and only one transistor at a time changes from a conducting to a non-conducting state or conversely.

Figure 3:
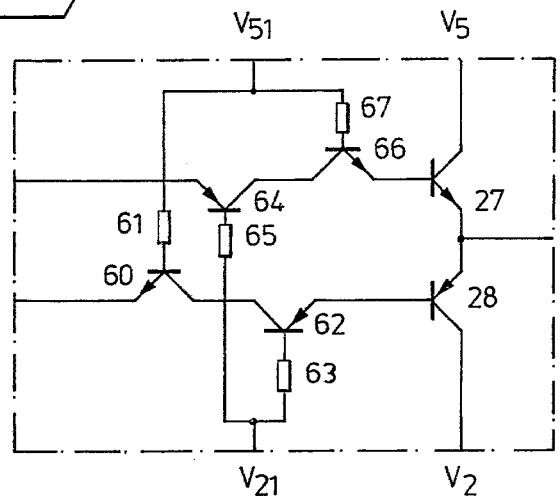
FIG. 3 shows an alternative construction of a partial amplifier using transistors and FIG. 4 shows in principle the same circuit as FIG. 3 but with an application to field effect transistors.

FIG. 3 shows a partial amplifier where a pnp-transistor 64 and a npn-transistor 66 have their emitter-collector respectively collector-emitter connections coupled in series between the positively voltage biased input signal and the base of the amplification npn-transistor 27. The pnp-transistor 64 constitutes the lower gate and therefore has its base connected to the lower gate voltage $V_{21}$ via a resistance 65. The npn-transistor 66 constitutes the upper gate and has its base connected to the upper gate voltage $V_{51}$.

The amplification pnp-transistor 28 is controlled by the npn-transistor 60 and the pnp-transistor 62 via the resistances 61 and 63 in an exactly complementary manner.

Figure 4:
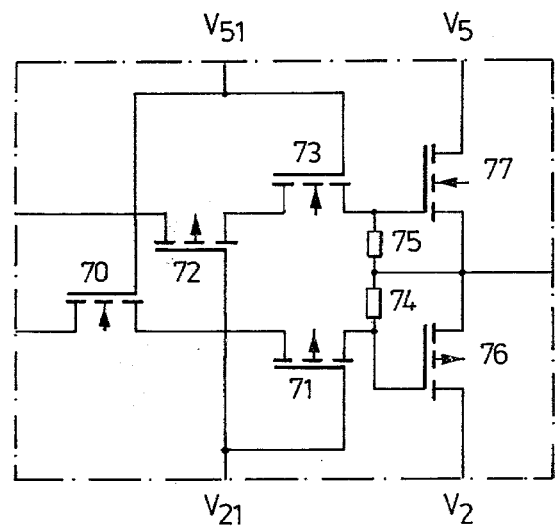

FIG. 4 shows a partial amplifier according to the same principle as the partial amplifier in FIG. 3 but built by the use of field-effect transistors with complementary amplification transistors 77 and 76 and gate transistors 72, 73 and 70, 71 for lower and upper gate voltage. Any resistances for the control electrodes of the gate transistors are not necessary, but instead there are required resistances 75, 74, keeping the control electrodes of the amplification transistors on a cut off bias, when the gates do not supply voltages.

Depending on which type of field-effect transistor is used, it may be necessary to connect the biasing voltages in a different way than according to FIG. 4, where it is presumed that the transistors are kept on a cut off bias, when the gate (control electrode) and the source (emitter) have the same potential.

Figure 5:
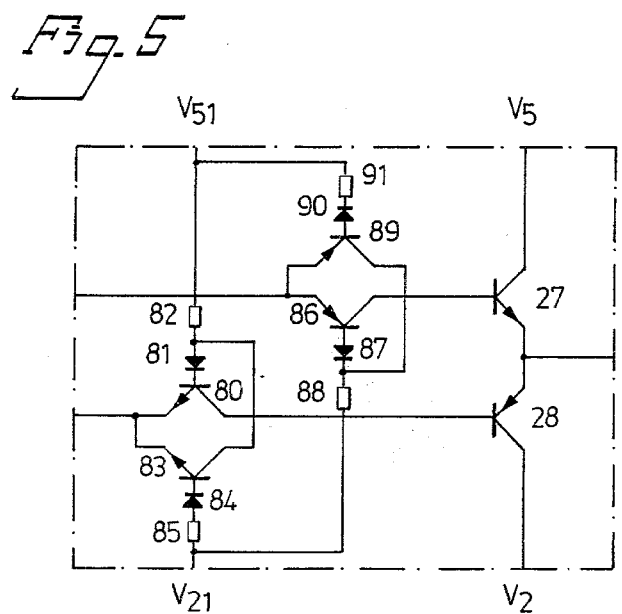
FIG. 5 shows a third alternative for the building of a partial amplifier with transistors and FIG. 6 shows a variant of the diagram according to FIG. 5.

FIG. 5 shows a partial amplifier, where the transistor 80, the diode 81 and the resistance 82 constitute the upper gate of the amplification transistor 28, while the transistor 83, the diode 84 and the resistance 85 constitute the lower gate of the amplification transistor 28. The transistor 86, the diode 87 and the resistance 88 constitute the lower gate of the amplification transistor 27 and the transistor 89, the diode 90 and the resistance 91 constitute the upper gate of the amplification transistor 27. The transistor 89 for the upper gate voltage works via the transistor 86 for the lower gate voltage just as the transistor 83 for the lower gate voltage works via the transistor 80 for the upper gate voltage.

Figure 6:
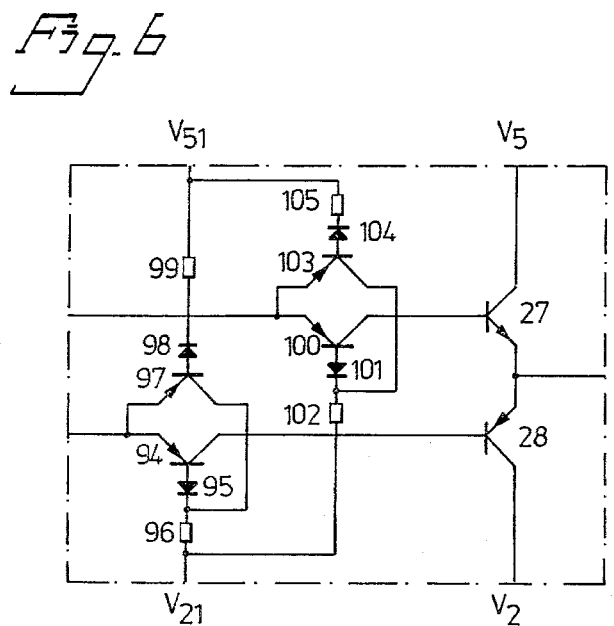

FIG. 6 shows a variant of a partial amplifier according to FIG. 5, where for both amplification transistors 28, 27, the pnp-transistors 97, 103 in the upper gates, also containing the diodes 98, 104 and the resistances 99, 105, work via the lower gates comprising the pnp-transistor 94, the diode 95 and the resistance 96, and the pnp-transistor 100, the diode 101 and the resistance 102.

FIG. 7 shows an example of how the control of the change-over of the output effect from one partial amplifier to another can be effected. A first partial amplifier 8 according to FIG. 5 has its upper gates connected to components, which cause the lower gates in the next partial amplifier 9 to allow the input voltage to pass when the upper gates in the first partial amplifier block the base current to its amplification transistors.

The base current to the transistor 89 in the upper gate of the amplification npn-transistor 27 is also caused to bias (with the potential $V_{52}$) the base of a npn-transistor 110, whose emitter has the potential $V_{54}$ and whose collector via the protective diode 112 is connected to the lower gate reference input (with the potential $V_{41}$) for the amplification npn-transistor 37 in the partial amplifier 9. As the current in the resistance 91, which controls the change-over between the partial amplifiers, is caused to control the amplification transistor 27 via the transistors 89 and 86 and at the same time to control the amplification transistor 37 also via two transistors, the delays will compensate each other.

In an identically like manner but with complementary components the change-over between the amplification pnp-transistors 28 and 38 will be effected. Here the base of the pnp-transistor 111 is connected to the lower gate reference voltage $V_{42}$ for the amplification pnp-transistor 38, its emitter is connected to the potential $V_{53}$ and its collector via the protective diode 113 is connected to the upper gate reference voltage $V_{51}$ for the amplification pnp-transistor 28.

In like manner the change-over between partial amplifiers according to FIG. 6 may be controlled.

Likewise the transistor 66 in FIG. 3 may via its base current and a suitable bias current added thereto control a transistor, which controls the base current to the corresponding transistor 62 of the next partial amplifier.

What is claimed is:

1. An electrical amplifier comprising several partial amplifiers, which are so connected and voltage fed that each of the several partial amplifiers amplifies its own voltage interval of an input voltage, wherein each partial amplifier has an input terminal for receiving a common input voltage, amplifying and controlling components responsive to gate voltages applied thereto for amplifying and controlling the input voltage during said voltage interval, and an output terminal for providing an output voltage and output current, and wherein each partial amplifier is supplied by respective pairs of power-feed voltage supplies with two power-feeding voltages capable of having the same polarity, one of said pair of voltage supplies operating to give output current to the output terminal when said output current and output voltages have the same polarity, and the other of said pair of voltage supplies operating to receive output current from the output terminal when the output current and output voltage have the opposite polarity, said controlling components comprising gates connected to a lower constant gate voltage and an upper constant gate voltage defining the limits of an active amplification interval of the partial amplifier, said gates being so arranged that input signals are transferred and amplified by the amplifying components of said partial amplifier only in a limited voltage interval defined by said lower gate voltage and said upper gate voltage.

2. The amplifier of claim 1, wherein the amplifying components in each partial amplifier comprise at least one of general linear amplifiers and push-pull complementary transistor output amplifiers connected to the output and input, respectively, of the electrical amplifier, and the controlling components comprise at least one of comparators, logic units, switches, and nonlinear amplifiers comprising transistors and diodes, said controlling components controlling the input of the amplifying elements as to currents received from and provided to the voltage supplies and to the output.

3. The amplifier of claim 1, wherein additional components are connected between each two partial amplifiers with adjacent voltage intervals in order to activate, under influence of the input voltage, a first working partial amplifier, said additional components being connected to further devices which deactivate and block the amplification elements in a second partial amplifier.

4. The amplifier of claim 3, comprising change-over units, and wherein the currents and voltages in the partial amplifiers control said change-over units which detect when a partial amplifier ceases to emit or receive current and then actuate, with respect to voltage, amplification elements in an adjacent partial amplifier to take over the output currents.

5. The amplifier of claim 4, wherein the base current from the transistors in the gates blocking the amplification transistors of a partial amplifier is provided to a change-over unit, and said base current being also the base current for a further transistor having an emitter connected to a gate voltage and a collector connected to the base resistance of an additional transistor located in the gate of the next partial amplifier for activating an amplification element in the next partial amplifier.

6. The amplifier as defined in claim 1, wherein each of said partial amplifiers is provided with amplification elements comprising complementary amplification transistors having control electrodes connected to one of the respective power-feed voltage means and a third electrode connected to the output terminal.

7. The amplifier of claim 6, wherein the complementary amplification transistors include emitters connected to a further output, collectors connected via diodes to the respective power-feed voltage supply means, and bases connected via further complementary transistors to an input transformer, the further complementary transistors having bases connected via resistances and diodes to constant lower and upper gate voltages, respectively, which constitute the limits of the active voltage interval of the partial amplifier.

8. The amplifier of claim 7, wherein the further output to which the emitters of the complementary amplification transistors are connected comprises an output transformer.

9. The amplifier of claim 8, wherein the complementary amplification transistors derive base potentials from the input voltage via series connections of emitter-collector and collector-emitter on respective ones of two complementary transistors having bases connected via resistances to gate voltages which determine the active voltage interval.

10. The amplifier of claim 8, wherein the complementary amplification transistors derive base potentials from the input voltage via emitter-collector arrangements on respective ones of two primary complementary transistors having bases connected via diodes and resistances to lower and upper gate voltages, respectively, which determine the active voltage interval, and further comprising secondary complementary transistors, and primary transistors having collector currents which can be blocked by said secondary complementary transistors having collectors and emitters connected to the base and emitter, respectively, on the primary transistors and having bases connected via diodes and resistances to the upper and lower gate voltages, respectively.

11. The amplifier of claim 1, wherein the complementary amplification transistors derive base voltages from the input voltage via one of emitter-collector and collector-emitter arrangements in two primary transistors having bases connected via diodes and resistances to the lower gate voltage, and including secondary transistors which block the collector currents of the primary transistors, said secondary transistors having collectors and emitters connected to the base and emitter, respectively on the primary transistors and having bases connected via diodes and resistances to the upper gate voltage.

12. The amplifier of claim 1, wherein the amplifying and controlling components comprise field effect transistors.

* * * * *